(12) United States Patent
Cardanobile

(10) Patent No.: US 10,752,493 B2
(45) Date of Patent: Aug. 25, 2020

(54) MICROMECHANICAL SPRING FOR AN INERTIAL SENSOR

(71) Applicant: Robert Bosch GmbH, Stuttgart (DE)

(72) Inventor: Stefano Cardanobile, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 231 days.

(21) Appl. No.: 16/069,215

(22) PCT Filed: Jan. 11, 2017

(86) PCT No.: PCT/EP2017/050445
§ 371 (c)(1),
(2) Date: Jul. 11, 2018

(87) PCT Pub. No.: WO2017/121742
PCT Pub. Date: Jul. 20, 2017

(65) Prior Publication Data
US 2019/0002274 A1    Jan. 3, 2019

(30) Foreign Application Priority Data

Jan. 15, 2016 (DE) .................. 10 2016 200 491

(51) Int. Cl.
*B81B 3/00* (2006.01)
*B81C 1/00* (2006.01)
*G01P 15/08* (2006.01)

(52) U.S. Cl.
CPC ............ *B81B 3/007* (2013.01); *B81B 3/0021* (2013.01); *B81C 1/00658* (2013.01); *G01P 15/0802* (2013.01); *B81B 2201/0235* (2013.01); *B81B 2201/0242* (2013.01); *B81B 2203/0163* (2013.01); *B81B 2203/0307* (2013.01); *F16F 2228/066* (2013.01)

(58) Field of Classification Search
None
See application file for complete search history.

(56) References Cited

U.S. PATENT DOCUMENTS

| 6,923,062 B2 * | 8/2005 | Franz | B81B 3/0051 |
| | | | 73/514.01 |
| 7,000,473 B2 * | 2/2006 | Vandemeer | G01P 15/08 |
| | | | 73/514.32 |
| 2005/0229706 A1 | 10/2005 | Vandemeer et al. | |

FOREIGN PATENT DOCUMENTS

| DE | 102013208699 A1 | 11/2014 |
| WO | 2005/067378 A2 | 7/2005 |

OTHER PUBLICATIONS

International Search Report dated Mar. 31, 2017 of the corresponding International Application PCT/EP2017/050445 filed Jan. 11, 2017.

* cited by examiner

*Primary Examiner* — Justin N Olamit
(74) *Attorney, Agent, or Firm* — Norton Rose Fulbright US LLP; Gerard Messina

(57) ABSTRACT

A micromechanical spring for an inertial sensor includes first and second spring elements situated parallel to each other and anchored on an anchoring element of the inertial sensor; and a third spring element situated between the two spring elements, anchored on the anchoring element, and having on both external sides a defined number of nub elements that are formed so as to have an increasing distance from the spring elements in a defined fashion as the distance from the anchoring element increases.

8 Claims, 3 Drawing Sheets

MICROMECHANICAL SPRING FOR AN INERTIAL SENSOR

CROSS-REFERENCE TO RELATED APPLICATIONS

The present application is the national stage of International Pat. App. No. PCT/EP2017/050445 filed Jan. 11, 2017, and claims priority under 35 U.S.C. § 119 to DE 10 2016 200 491.3, filed in the Federal Republic of Germany on Jan. 15, 2016, the content of each of which are incorporated herein by reference in their entireties.

FIELD OF THE INVENTION

The present invention relates to a micromechanical spring for an inertial sensor, to a method for producing a micromechanical spring for an inertial sensor, and to an inertial sensor having at least one micromechanical spring.

BACKGROUND

Micromechanical inertial sensors (acceleration and rotational rate sensors) are limited in their freedom of movement by stop elements. A task of the stop elements is, through the application of a deformation to the inertial sensor, to minimize kinetic energy that the movable mass possesses when it contacts fixed electrodes of the inertial sensors. In this way, damage to the named electrodes can be minimized.

In micromechanics, in order to perform specific measurement tasks, non-linear beam structures are known for example from WO 2005/067379 A2, which discloses a testing device and a method for measuring force on deformable micromechanical structures (MEMS structures), where a protruding beam of the MEMS structure having a free end and a fixed end is bent against a curved segment until the protruding beam breaks. From the remaining length of the beam, a force that caused the breakage of the beam can be inferred.

SUMMARY

An object of the present invention is to provide an improved micromechanical spring for an inertial sensor.

According to an example embodiment of the present invention, a micromechanical spring for an inertial sensor includes: first and second spring elements that are situated parallel to one another and are anchored on an anchoring element of the inertial sensor; and a third spring element situated between the two spring elements and anchored on the anchoring element, the third spring element having on both external sides a defined number of nub elements that are formed having increasing distances from the first and second spring elements in a defined fashion as the distance from the anchoring element increases.

In this way, as a function of a contacting of the nub elements with each of the parallel spring elements, an effective length of the spring is shortened, and as a result a type of regulating mechanism is realized relating to the resetting force for the micromechanical spring. As a result, a reset force is formed in non-linear fashion as a function of a number of the nub elements contacting one of the parallel spring elements. Advantageously, in this way a large degree of design play for the micromechanical spring is supported.

According to an example embodiment of the present invention, a method for producing a micromechanical spring for an inertial sensor includes: providing a first spring element and a second spring element; anchoring the first and second spring elements in parallel on an anchoring element of the inertial sensor; providing a third spring element and anchoring the third spring element between the first and second spring elements, with a defined number of nub elements being situated on both external sides on the third spring element that are formed having an increasing distance from the spring elements as the distance from the anchoring element increases.

In an example embodiment, the first and spring elements are connected to each other at their end regions by a connecting element. In this way, a kind of U-spring is created that supports stable operating properties of the micromechanical spring.

In an example embodiment, at least one nub element is respectively situated on both sides on external sides of the first and second spring elements. In this way, a fastening of the seismic mass to the micromechanical spring can advantageously be better defined.

In the following, the present invention, with further features and advantages, is described in detail on the basis of a plurality of figures. All described features form subject matter of the present invention, independent of their representation in the description and in the figures, and independent of their relations of dependence in the patent claims. The figures are intended in particular to illustrate the principles essential to the present invention, and are not necessarily true to scale. Identical or functionally identical elements have identical reference characters.

Disclosed device features result analogously from corresponding disclosed method features, and vice versa. This means in particular that features, technical advantages, and embodiments relating to the method for producing a micromechanical spring for an inertial sensor result analogously from corresponding embodiments, features, and advantages relating to the micromechanical spring for an inertial sensor, and vice versa.

DETAILED DESCRIPTION

Stop elements for inertial sensors can be fashioned as fixed or as springy structures. Springy stop elements have in particular the following two functions: through their deformation, they contribute to the dismantling of the critical energy; and through their reset force, they can remove the sensor from a "sticky" or "caught" state.

A point of difficulty in the design of the springy stop elements is their correct dimensioning. A too-soft stop element cannot perform its intended tasks because it cannot absorb much mechanical energy and has only a small reset force. A too-hard stop element effectively acts as a fixed stop and therefore also cannot perform its intended tasks.

Figure 1:
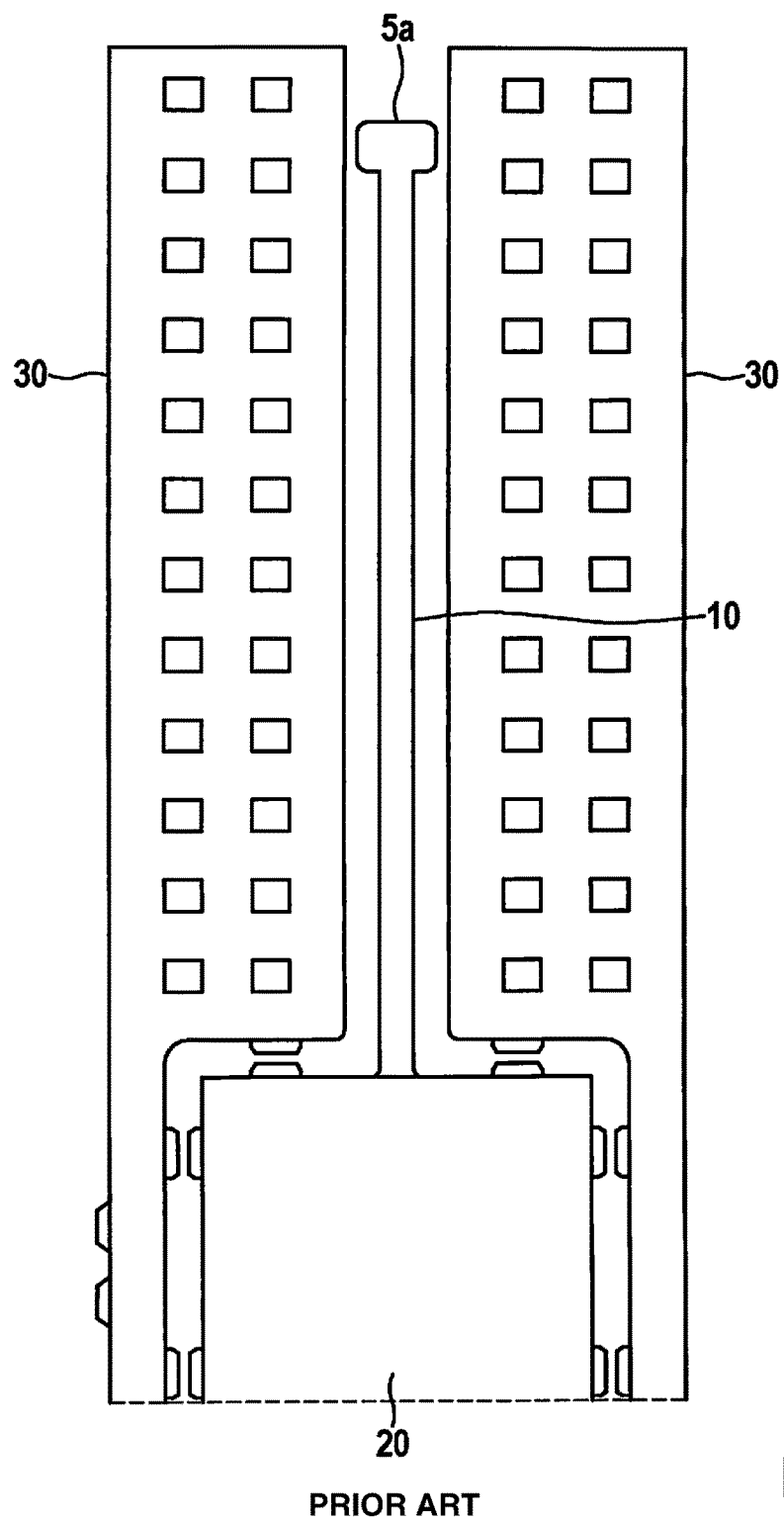
FIG. 1 shows a conventional micromechanical spring.

FIG. 1 shows a top view of a conventional micromechanical spring 10 for an inertial sensor. It can be seen that spring 10 is made essentially oblong, and is anchored or fixed on the inertial sensor by an anchoring element 20. On the tip of spring 10 there is formed a nub element 5a that is provided for attachment to seismic masses 30 of the inertial sensor.

In this conventional design, it can be problematic that there is only a small degree of design play, and spring 10 has to be precisely dimensioned in order to function properly. This is because if spring 10 is too soft, very little mechanical energy can be absorbed and only very small reset forces are activated. If spring 10 is too hard, it acts as a fixed mass that is not capable of applying any reset force to seismic mass 30. For this reason, the design of conventional micromechanical spring 10 has to lie precisely between these two extremes so that an effective reset force can be generated.

Figure 2:
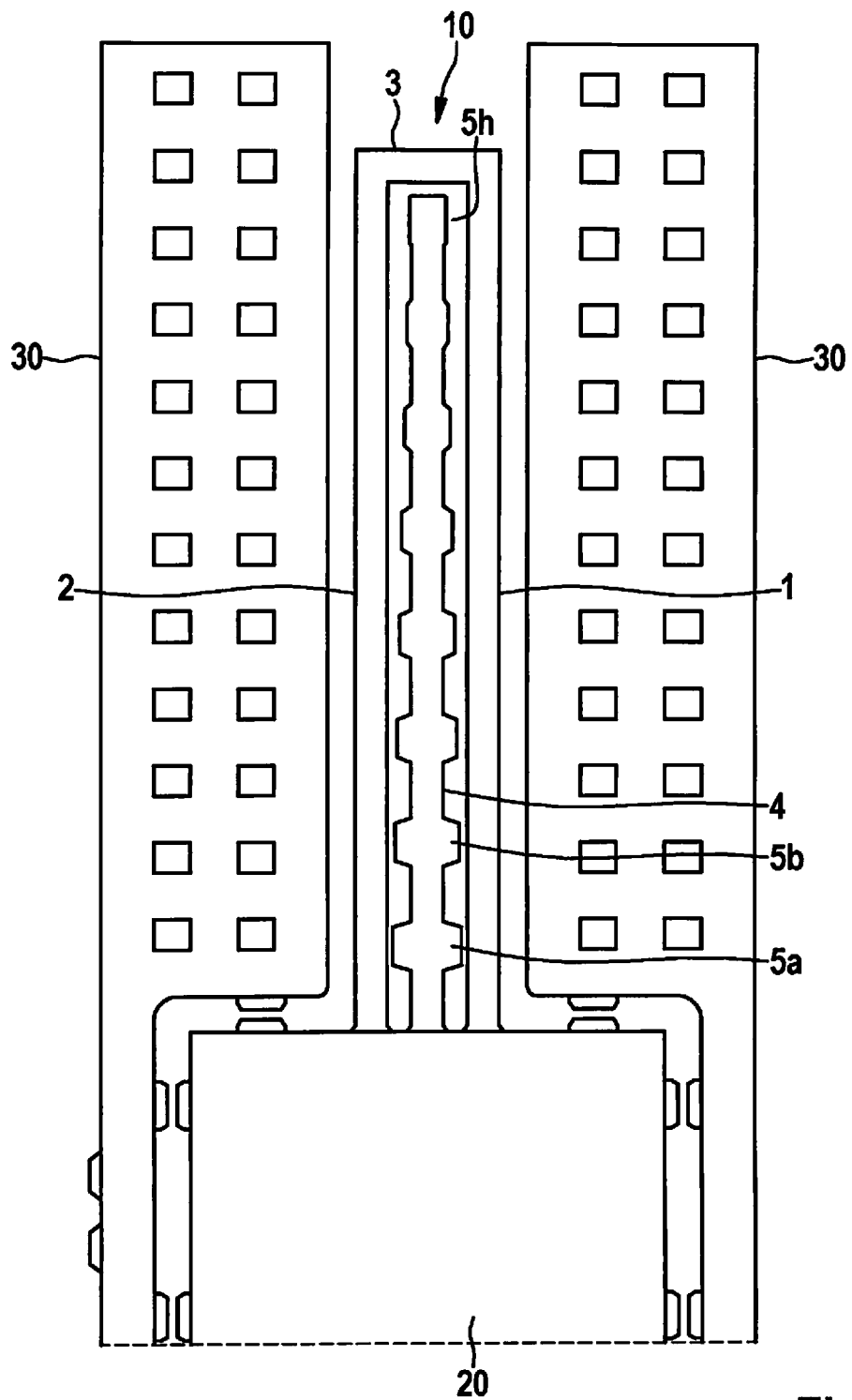
FIG. 2 shows a micromechanical spring according to an example embodiment of the present invention.

According to an example embodiment of the present invention, a micromechanical spring 10 has a significantly larger degree of play in its design than does conventional spring 10 of FIG. 1. FIG. 2 shows a top view of an example embodiment of such a micromechanical spring 10. It can be seen that spring 10 has a first spring element 1 and a second spring element 2 that are made straight and are anchored on anchoring element 20 of the inertial sensor so as to be situated parallel to each other. The two spring elements 1, 2 are connected by a connecting element 3 at the tip. In an alternative example embodiment, it is also conceivable for connecting element 3 to be omitted (not shown). Between the two spring elements 1, 2 there is situated a third spring element 4 that is fixed on anchoring element 20 and has on both external sides nub elements 5a . . . 5h, which have a greater distance from the two spring elements 1, 2 as the distance from anchoring element 20 increases.

In this way, it is achieved that when seismic mass 30 contacts one of the spring elements 1, 2, first nub element 5a is contacted with one of the spring elements 1, 2, which reduces the effective length of spring 10. As the force of seismic mass 30 on one of the spring elements 1, 2 increases, more and more nub elements 5a . . . 5h are brought into contact with spring element 1, 2. Between the time at which first nub element 5a and next-to-last nub element 5g are contacted, a non-linear characteristic of the spring force is realized for spring 10, micromechanical spring 10 becoming increasingly stiffer during this time.

In another example embodiment (not shown in the figures) of micromechanical spring 10, it can also be provided that at least one nub element 5a . . . 5n is situated on the external sides of spring elements 1, 2. In this way, an even better-defined contact of seismic mass 30 on spring element 1, 2 can take place.

The non-linear characteristic of the spring force holds for the following number K of contacted nub elements 5a . . . 5n: 1<K≤n−1, where K is the number of contacted nub elements and n is the total number of nub elements.

The non-linear spring force is greater than the linear spring force, and effectively enables a very effective reset force of spring 10 that acts on seismic mass 30. In the case in which the last nub element 5a . . . 5n is also contacted, i.e., all nub elements 5a . . . 5n contact spring element 1, 2, the overall structure of micromechanical spring 10 again behaves with a linear spring characteristic. For this purpose, the number of nub elements 5a . . . 5n is suitably dimensioned, as are the distances of nub elements 5a . . . 5h among one another, as well as the distances of nub elements 5a . . . 5n from spring elements 1, 2.

As a result, in this way a three-level operating characteristic of micromechanical spring 10 can be achieved as follows:

Low load: in this case only the soft stop acts through spring elements 1, 2. The mechanical energy is mainly dismantled in seismic mass 30 of the sensor, in accordance with Hooke's Law.

Medium load: one after the other, going out from anchoring element 20, nub elements 5a . . . 5n come into contact with one of the spring elements 1, 2, depending on the direction from which the impact of seismic mass 30 takes place. In this way, the outer, contacted spring element 1, 2 becomes effective, and the reset force increases more rapidly than would be expected according to Hooke's Law. Preferably, the reset force of micromechanical spring 10 increases quadratically as the number of contacted nub elements 5a . . . 5n increases.

High load: all nub elements 5a . . . 5n are in contact with spring element 1, 2. In this case, a reset force of spring element 4 and of one of the spring elements 1, 2 acts. If micromechanical spring 10 is realized as a U-spring (having connecting element 3), all three spring elements 1, 2, 4 act. The stop contributes significantly to the dismantling of energy, and here Hooke's Law again applies, but with a higher degree of stiffness than at the beginning.

An alternative example embodiment (not shown in the figures) of micromechanical spring 10 could be realized in that spring elements 1, 2, and 4 are made curved. In this case as well, spring element 4 with nub elements 5a . . . 5n is situated between curved spring elements 1, 2.

As a result, the present invention creates a spring structure that brings about a non-linear springy stop with a parallel spring suspended at an anchoring point, having cascaded fixed stops in its interior. The rigidity of the inner spring element is greater than that of the outer spring elements due to the nub elements. In this way, the rigidity of the stop dynamically changes starting from the time at which the first nub element of the inner spring element was contacted.

Figure 3:
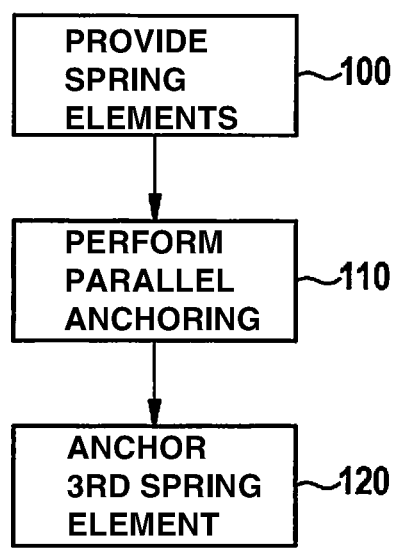
FIG. 3 is a flowchart that illustrates at a method for producing a micromechanical spring for an inertial sensor, according to an example embodiment of the present invention.

FIG. 3 shows a schematic sequence of an example embodiment for producing a micromechanical spring for an inertial sensor. In a step 100, a first spring element 1 and a second spring element 2 are provided. In a step 110, a parallel anchoring of first spring element 1 and of second spring element 2 on an anchoring element 20 of the inertial sensor is carried out. In a step 120, a third spring element 4 is provided and an anchoring of third spring element 4 between the two spring elements 1, 2 is carried out, a defined number of nub elements 5a . . . 5n being situated on both external sides on third spring element 4, having an increasing distance from spring elements 1, 2, as the distance from anchoring element 20 increases.

In sum, the present invention provides an improved micromechanical spring for an inertial sensor. The inertial sensor can for example be formed as an acceleration sensor. Advantageously, with the proposed structure a greater dynamic range can be realized in which the micromechanical spring acts as an elastic structure.

Although the present invention has been described above on the basis of concrete specific embodiments, it is in no way limited thereto. The person skilled in the art will thus recognize that a large number of modifications of the proposed micromechanical spring are possible, corresponding to the proposed design.

What is claimed is:

1. A micromechanical spring for an inertial sensor, comprising:
   an anchor;
   a first spring element anchored to the anchor;
   a second spring element anchored to the anchor and extending in parallel to the first spring element; and a third spring element anchored to the anchor, extending from the anchor between the first and second spring elements;

wherein along a length of a first of two external sides of the third spring element extending from the anchor, there is a first plurality of nub elements, each of which extends from the third spring element towards the first spring element, wherein respective distances of the nub elements of the first plurality from the first spring element vary such that as a distance increases between a nub element and the anchor, a distance of the nub element from the first spring element increases; and wherein along a length of a second of two external sides of the third spring element extending from the anchor, there is a second plurality of nub elements, each of which extends from the third spring element towards the second spring element, wherein respective distances of the nub elements of the second plurality from the second spring element vary such that as a distance increases between a nub element and the anchor, a distance of the nub element from the second spring element increases.

2. The micromechanical spring of claim 1, wherein an end region of the first spring element and an end region of the second spring element are connected to each other by a connecting element.

3. The micromechanical spring of claim 1, wherein each of the first and second spring elements includes at least one nub element on an external side of a respective one of the spring elements.

4. An inertial sensor, comprising;
a micromechanical spring, including:
an anchor;
a first spring element anchored to the anchor;
a second spring element anchored to the anchor and extending in parallel to the first spring element; and
a third spring element anchored to the anchor, extending from the anchor between the first and second spring elements;
wherein along a length of a first of two external sides of the third spring element extending from the anchor, there is a first plurality of nub elements, each of which extends from the third spring element towards the first spring element, wherein respective distances of the nub elements of the first plurality from the first spring element vary such that as a distance increases between a nub element and the anchor, a distance of the nub element from the first spring element increases; and
wherein along a length of a second of two external sides of the third spring element extending from the anchor, there is a second plurality of nub elements, each of which extends from the third spring element towards the second spring element, wherein respective distances of the nub elements of the second plurality from the second spring element vary such that as a distance increases between a nub element and the anchor, a distance of the nub element from the second spring element increases.

5. A method for producing a micromechanical spring for an inertial sensor, the method comprising:
anchoring a first spring element and a second spring element to an anchor so that they extend from the anchor in parallel;
anchoring a third spring element to the anchor between the first and spring elements, wherein the third spring element;
wherein along a length of a first of two external sides of the third spring element extending from the anchor, there is a first plurality of nub elements, each of which extends from the third spring element towards the first spring element, wherein respective distances of the nub elements of the first plurality from the first spring element vary such that as a distance increases between a nub element and the anchor, a distance of the nub element from the first spring element increases; and
wherein along a length of a second of two external sides of the third spring element extending from the anchor, there is a second plurality of nub elements, each of which extends from the third spring element towards the second spring element, wherein respective distances of the nub elements of the second plurality from the second spring element vary such that as a distance increases between a nub element and the anchor, a distance of the nub element from the second spring element increases.

6. The method of claim 5, wherein an end region of the first spring element and an end region of the second spring element are connected to each other by a connecting element.

7. The method of claim 5, wherein the respective distances of the nub elements from the respective ones of the first and second spring elements are such that a non-linear spring characteristic is produced for the micromechanical spring given contacting of a number $1<K\leq n-1$ of the nub elements with one of the spring elements.

8. The method of claim 7, wherein each of the first and second spring elements includes at least one nub element on an external side of a respective one of the spring elements.

* * * * *